(12) United States Patent
Lim

(10) Patent No.: US 7,355,274 B2
(45) Date of Patent: Apr. 8, 2008

(54) SEMICONDUCTOR PACKAGE, MANUFACTURING METHOD THEREOF AND IC CHIP

(75) Inventor: Gwang-Man Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/146,001

(22) Filed: Jun. 7, 2005

(65) Prior Publication Data
US 2006/0125070 A1    Jun. 15, 2006

(30) Foreign Application Priority Data
Dec. 10, 2004  (KR) .................. 10-2004-0104247

(51) Int. Cl.
*H01L 23/02* (2006.01)

(52) U.S. Cl. .................. 257/686; 257/E25.013; 257/685; 257/723; 257/777; 438/109; 438/613

(58) Field of Classification Search ........ 257/E23.092, 257/E25.023, 686, 685, 723, 784, 777, E23.129, 257/E25.013, 733, 787, 738, 786, 778, 783; 438/109, 613
See application file for complete search history.

(56) References Cited

U.S. PATENT DOCUMENTS

| 5,598,033 | A * | 1/1997 | Behlen et al. ............... 257/686 |
| 5,973,930 | A * | 10/1999 | Ikeda et al. ................ 361/768 |
| 6,329,220 | B1 * | 12/2001 | Bolken et al. .............. 438/106 |
| 6,407,448 | B2 * | 6/2002 | Chun ........................ 257/678 |
| 6,534,723 | B1 * | 3/2003 | Asai et al. .................. 174/255 |
| 6,768,190 | B2 * | 7/2004 | Yang et al. ................. 257/686 |
| 6,777,799 | B2 * | 8/2004 | Kikuma et al. ............. 257/686 |
| 6,787,915 | B2 * | 9/2004 | Uchida et al. .............. 257/777 |
| 6,815,254 | B2 * | 11/2004 | Mistry et al. ............... 438/108 |
| 6,856,009 | B2 * | 2/2005 | Bolken et al. .............. 257/686 |
| 7,026,709 | B2 * | 4/2006 | Tsai et al. ................... 257/686 |

FOREIGN PATENT DOCUMENTS

| KR | 10-0375168 | 2/2003 |
| KR | 2003-0040922 | 5/2003 |
| KR | 2003-0045949 | 6/2003 |

* cited by examiner

*Primary Examiner*—Kenneth Parker
*Assistant Examiner*—Chris C. Chu
(74) *Attorney, Agent, or Firm*—Harness, Dickey & Pierce, P.L.C.

(57) ABSTRACT

A package may include a lower unit package and an upper unit package. Each of the unit packages may include a circuit substrate having a lower surface and an upper surface. Wire bonding pads may be provided of the lower surface of the circuit substrate, and chip bonding pads may be provided on the upper surface of the circuit substrate. An IC chip may be provided on the lower surface of the circuit substrate. The IC chip may have an active surface with wire lands and bump lands. Chip bumps may be provided on the bump land. The wire bonding pads of the circuit substrate may be connected to the wire lands of the IC chip using bonding wires. The chip bumps of the upper unit package may be connected to the chip bonding pads of the lower unit package. An IC chip may include a substrate. A conductive layer may be provided on the substrate. The conductive layer may define a bump land for supporting a chip bump and a wire land for connecting to a bonding wire. The bump land and the wire land may be spaced apart from each other on an active surface of the IC chip.

13 Claims, 8 Drawing Sheets

SEMICONDUCTOR PACKAGE, MANUFACTURING METHOD THEREOF AND IC CHIP

PRIORITY STATEMENT

This U.S. Non-provisional application claims benefit of priority under 35 U.S.C. § 119 from Korean Patent Application No. 2004-104247, filed on Dec. 10, 2004, the entire contents of which are incorporated herein by reference.

BACKGROUND

1. Field of the Invention

The present invention relates in general to a semiconductor packaging technique and, more particularly, to a semiconductor chip stack package and a method for manufacturing the semiconductor chip stack package.

2. Description of the Related Art

In an effort to improve integration in a package assembly process, stacking techniques may be employed in which a plurality of integrated circuit ("IC") chips and/or unit packages may be stacked on a circuit substrate. An example stacking technique may implement bare chip packages.

Bare chip packages (e.g., flip chip packages and wafer level packages) may have IC chips on which conductive bumps may be provided as external connection structures. Bare chip packages may reduce package size to a chip size level, similar to chip scale packages.

Various methods may be employed for manufacturing stack packages using bare chip packages. For example, bare chips may be flip chip bonded on a flexible circuit substrate and the flexible circuit substrate may be bent to form a vertical stack structure. Bare chips may have via holes to connect wirings of upper and lower chips. Bare chips may be mounted on a circuit substrate and connected to the circuit substrate using connection terminals.

Although the conventional methods are generally thought to be acceptable, they are not without shortcomings. For example conventional techniques may result in complicated stack structures and/or conventional techniques may involve difficult and/or inefficient stacking processes. Further, connection terminals connecting upper and lower bare chips may be exposed to the external environment, and this may reduce reliability. The connection terminals (which may be arranged on the outside of bare chips) may lead to increased package size.

SUMMARY

According to an example, non-limiting embodiment of the present invention, a package may include a lower unit package and an upper unit package. The upper and the lower unit packages may each include a circuit substrate having a lower surface and an upper surface. Wire bonding pads may be provided on the lower surface of the circuit substrate, and chip bonding pads may be provided on the upper surface of the circuit substrate. An IC chip may be provided on the lower surface of the circuit substrate. The IC chip may have an active surface with wire lands and bump lands. Chip bumps may be provided on the bump lands. Bonding wires may connect the wire bonding pads of the circuit substrate to the wire lands of the IC chip. The chip bumps of the upper unit package may be connected to the chip bonding pads of the lower unit package.

According to another example, non-limiting embodiment of the present invention, a method may involve providing a first circuit substrate strip including a plurality of unit packages. The individual unit packages may be separated from the first circuit substrate strip. The individual unit packages may be provided on a second circuit substrate strip to provide a plurality of stack structures. A molding resin may be provided on the stack structures of the second circuit substrate strip. Individual stack packages may be separated from the second circuit substrate strip.

According to another example, non-limiting embodiment of the present invention, a package may include an upper unit package and a lower unit package. Each of the unit packages may include a circuit substrate supporting chip bonding pads. An IC chip may be provided on the circuit substrate. The IC chip may have an active surface with bump lands. Chip bumps may be provided on the bump lands. The chip bumps of the upper unit package may be connected to the chip bonding pads of the lower unit package.

According to another example, non-limiting embodiment of the present invention, a method may involve providing an upper unit package and a lower unit package. Each of the unit packages may include a circuit substrate supporting chip bonding pads. An IC chip may be provided on the circuit substrate. The IC chip may have an active surface with bump lands. Chip bumps may be provided on the bump lands of the upper unit package. The chip bumps of the upper unit package may be connected to the chip bonding pads of the lower unit package.

According to another example, non-limiting embodiment of the present invention, an IC chip may include a substrate. A conductive layer may be provided on the substrate. The conductive layer may define a bump land for supporting a chip bump and a wire land for connecting to a bonding wire. The bump land and the wire land may be spaced apart from each other on an active surface of the IC chip.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example, non-limiting embodiments of the invention.

DETAILED DESCRIPTION OF EXAMPLE EMBODIMENTS

Example, non-limiting embodiments of the present invention will now be described more fully with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted (or provided) either directly on the referenced element or mounted (or provided) on other elements overlaying the referenced element. Throughout this disclosure, the terms "upper" and "lower" are used for convenience in describing various elements or portions or regions of the elements as shown in the figures. These terms do not, however, require that the structure be maintained in any particular orientation.

Figure 1:
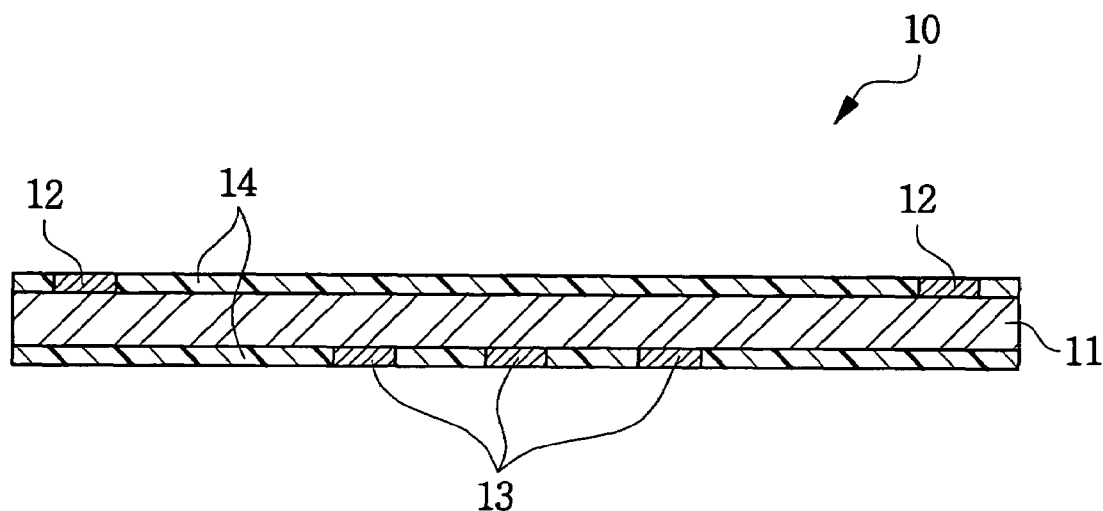
FIG. 1 is a cross-sectional view of a circuit substrate in accordance with an example, non-limiting embodiment of the present invention.

FIG. 1 is a cross-sectional view of a circuit substrate 10 in accordance with an example, non-limiting embodiment of the present invention.

Referring to FIG. 1, the circuit substrate 10 may have a substrate core 11 having an upper surface and a lower surface. A plurality of wire bonding pads 12 may be provided on the upper surface of the substrate core 11. A plurality of flip chip bonding pads 13 may be provided on the lower surface of the substrate core 11. By way of example only, the wire bonding pads 12 may be arranged on a peripheral region of the upper surface and the flip chip bonding pads 13 may be arranged on a central region of the second surface. In alternative embodiments, the wire bonding pads 12 and the flip chip bonding pads 13 may be arranged on other alternative regions of the upper and the lower surfaces, respectively, of the substrate core 11. A solder mask 14 may be provided on the upper and the lower surfaces of the substrate core 11. The wire bonding pads 12 may be exposed through the solder mask 14 provided on the upper surface, and the flip chip bonding pads 13 may be exposed through the solder mask 14 provided on the lower surface.

In this example embodiment, the substrate core 11 may include a single layer fabricated from a dielectric material. The substrate core 11 may also include one or more conductive layers (not shown). In alternative embodiments, the substrate core 11 may have a multi-layer structure that may include at least two dielectric layer and one or more conductive layers. The dielectric layer may be fabricated from a dielectric material, such as FR-4, polyimide, epoxy, phenol, and/or polyester, for example. The dielectric layer may be fabricated from numerous other alternative materials that are well known in this art. The wire bonding pads 12 and the flip chip bonding pads 13 may be fabricated from Cu (for example) and may be plated with Ni and Au (for example). Numerous alternative materials that are well known in this art may be used to fabricate the wire bonding pads 12 and the flip chip bonding pads 13. Moreover, the wire bonding pads 12 and the flip chip bonding pads 13 on a given substrate core 11 may be fabricated from different materials. Vias (not shown) may penetrate through the substrate core 11 to electrically connect the wire bonding pads 12 to the flip chip bonding pads 13. The solder mask 14 may be fabricated from a dielectric resin material (for example). The solder mask 14 may be fabricated from numerous other materials that are well known in this art.

Figure 2:
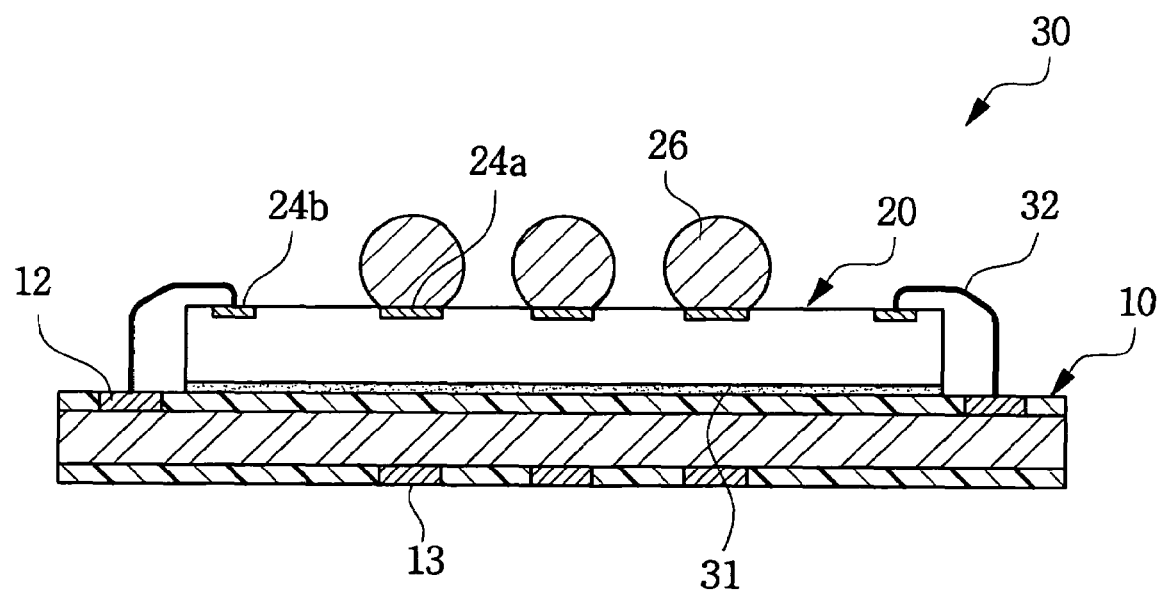
FIG. 2 is a cross-sectional view of a unit package in accordance with an example, non-limiting embodiment of the present invention.

FIG. 2 is a cross-sectional view of a unit package 30 in accordance with an example, non-limiting embodiment of the present invention. The unit package 30 may implement the circuit substrate 10 of FIG. 1.

Referring to FIG. 2, the unit package may include an IC chip 20 that may be provided on the circuit substrate 10. The IC chip 20 may be mechanically connected to the circuit substrate 10 using an adhesive layer 31 (for example). Other mechanical fasters may be implemented instead of (or in addition to) the adhesive layer 31. Such alternative mechanical fasteners may include screws, clips, staples, nails and pins, for example. The IC chip 20 may be electrically connected to the circuit substrate 10 using bonding wires 32 (for example). Other conductive members, which are well known in this art, may be suitably implemented to electrically connect together the IC chip 20 and the circuit substrate 10.

In this example embodiment, the IC chip 20 may be located between the wire bonding pads 12 of the circuit substrate 10. It will be readily appreciated, however, that in alternative embodiments, the wire bonding pads 12 may be provided on one or more sides of the IC chip 20 (e.g., the IC chip 20 may not be located between the wire bonding pads 12). The bonding wires 32 may have one end that may be connected to the wire bonding pads 12 of the circuit substrate 10 and another end that may be connected to wire lands 24b of the IC chip 20. The bonding wires 32 may be connected to the wire bonding pads 12 and the wire lands 24b via numerous and alternative wire bonding processes. The wire bonding pads 12 may be adjacent to the IC chip 20.

The bonding wires 32 may be provided via conventional wire bonding techniques. For example, the conventional bonding process may involve providing a ball bond on the wire bonding pad 12 followed by providing a wedge bond on the wire land 24b. The bonding wires 32 may also be provided via a bump reverse bonding technique that may involve providing a ball bond on the wire land 24b followed by providing a wedge bond on the wire bonding pad 12. The bonding wires 32 may also be provided via bonding techniques in which a ball bond may be provided on both the wire land 24b and the wire bonding pad 12, or in which a wedge bond may be provided on both the wire land 24b and the wire bonding pad 12. The connection portion of the wire lands 24b and wire bonding pads 12 may include a ball-ball type, a ball-wedge type, a wedge-ball type and a wedge-wedge type.

The adhesive layer 31 may include a liquid adhesive and/or an adhesive sheet. In alternative embodiments, the numerous and alternative adhesive materials, which are well known in this art, may be suitably implemented. The adhesive layer 31 may not touch the wire bonding pads 12. The bonding wires 32 may be fabricated from Au, Al, Ag and/or Cu, for example. Au wires may use an alloy containing Cu and/or Be, for example. The bonding wires may be fabricated from numerous other conductive materials that are well known in this art.

The IC chip 20 may have an active surface (the upper surface in FIG. 2) on which is provided bump lands 24a and the wire lands 24b. By way of example only, the bump lands 24a may be arranged on a central region of the active surface and the wire lands 24b may be arranged on a peripheral region of the active surface. In alternative embodiments, the bump lands 24a and the wire lands 24b may be arranged on other alternative regions of the active surface of the IC chip 20. Chip bumps 26 may be provided on the bump lands 24a. In this example embodiment, the chip bumps 26 may have a spherical shape. In alternative embodiments, the chip bumps 26 may have other geometrical shapes.

The bump lands 24a and the wire lands 24b may be fabricated from Cu (for example) and may be plated with Ni and/or Au (for example). Numerous alternative materials that are well known in this art may be used to fabricate the bump lands 24a and the wire lands 24b. Moreover, the bump lands 24a and the wire lands 24b on a given IC chip 20 may be fabricated from different materials. The chip bumps 26 may be fabricated from a solder and/or a conductive material such as Au (for example). Numerous alternative materials that are well known in this art may be used to fabricate the chip bumps 26.

Figure 3:
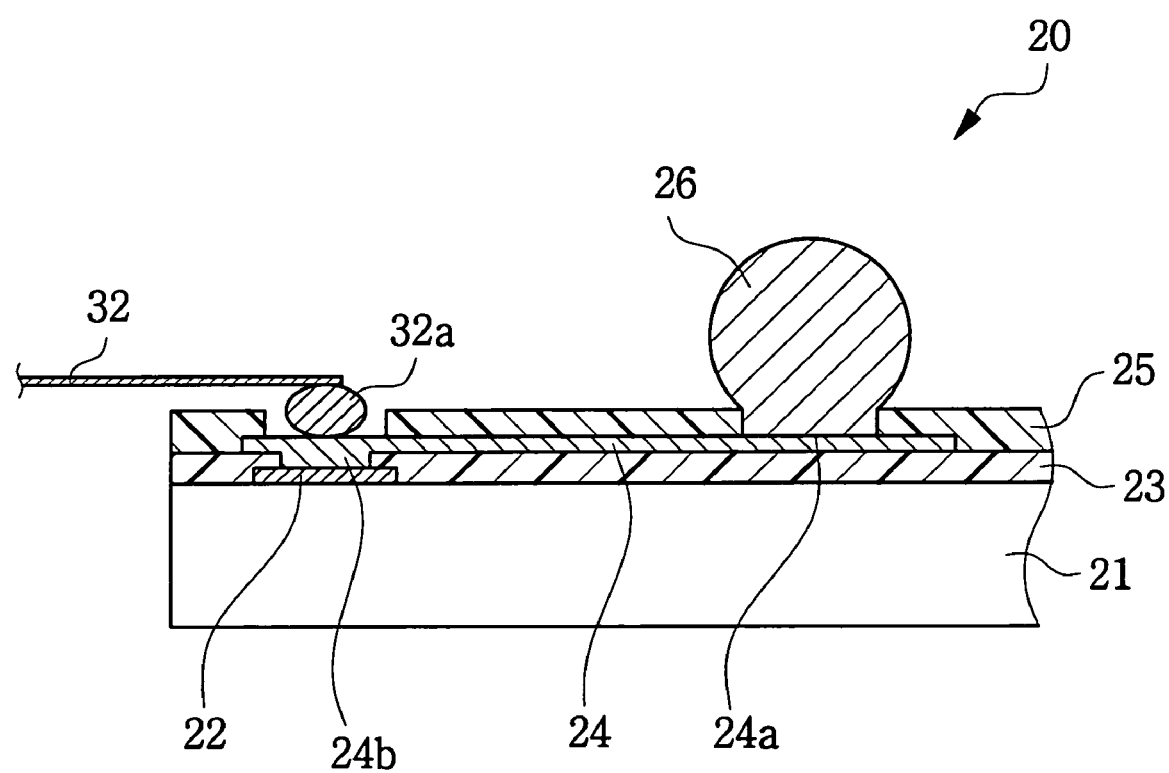
FIG. 3 is a partial cross-sectional view of an integrated circuit chip in accordance with an example, non-limiting embodiment of the present invention.

FIG. 3 is a partial cross-sectional view of an IC chip 20 in accordance with an example, non-limiting embodiment of the present invention.

Referring to FIG. 3, the IC chip 20 may include a substrate 21. In this example embodiment, the substrate 21 may be fabricated from silicon. In alternative embodiments, the substrate 21 may be fabricated from other alternative materials that are well known in this art.

The IC chip 20 may be fabricated using conventional wafer fabrication processes. By way of example only, an I/O terminal 22 may be provided on the upper surface of the substrate 21. A passivation layer 23 may be provided on the upper surface of the substrate 21. The I/O terminal 22 may be exposed through the passivation layer 23. A conductive layer in the form of a rerouting line 24 may be provided on the passivation layer 23. The rerouting line 24 may be electrically connected to the I/O terminal 22. A protective layer 25 may be provided on the rerouting line 24 and the passivation layer 23. A portion of the rerouting line 24 may be exposed through the protective layer 25. The exposed portions of the rerouting line 24 may correspond to the bump lands 24a and the wire lands 24b.

This example, non-limiting embodiment may implement a reverse bonding technique. According to the reverse bonding technique, a wire ball 32a may be formed at the end of the bonding wire 32 connected to the wire land 24b. The bonding wire 32 may extend horizontally to form a wire loop. The bonding wire 32 may be have a height less than that of the chip bump 26 relative to the upper surface of the IC chip 20.

Figure 4:
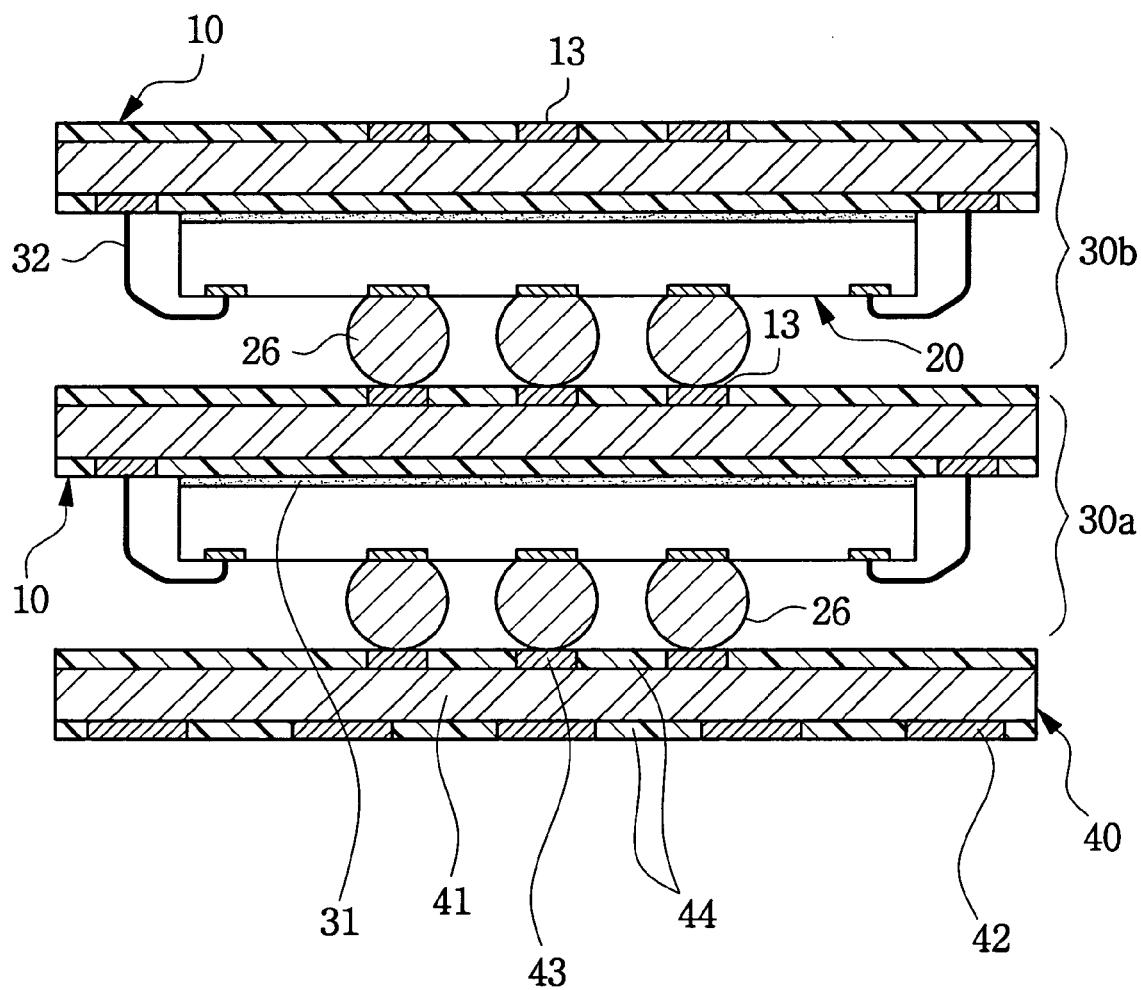
FIG. 4 is a cross-sectional view of a stack structure in accordance with an example, non-limiting embodiment of the present invention.

FIG. 4 is a cross-sectional view of a stack structure in accordance with an example, non-limiting embodiment of the present invention.

Referring to FIG. 4, a unit package 30a (referred to as a lower unit package) may be mounted on a second circuit substrate 40. A unit package 30b (referred to as an upper unit package) may be stacked on the lower unit package 30a. By way of example only, the second circuit substrate 40 may have a structure that is somewhat similar to the circuit substrate 10 of FIG. 1. In alternative embodiments, the second circuit substrate 40 may have a structure that is different than the substrate 10 of FIG. 1. The second circuit substrate 40 may be a lower most substrate of a stack package. The second circuit substrate 40 may have a substrate core 41 having an upper surface and a lower surface. A plurality of solder bump pads 42 may be provided on the lower surface of the substrate core 41. A plurality of flip chip bonding pads 43 may be provided on the upper surface of the substrate core 41. A solder mask 44 may be provided on the lower and the upper surfaces. The solder bump pads 42 and the flip chip bonding pads 43 may be exposed through the solder masks 44.

The lower and the upper unit packages 30a and 30b may be stacked such that the active surfaces of the IC chips 20 may face toward the second circuit substrate 40. The lower unit package 30a may be mounted on the upper surface of the second circuit substrate 40. The chip bumps 26 of the lower unit package 30a may be mechanically and electrically connected to the flip chip bonding pads 43 of the second circuit substrate 40. The mechanical connection between the chip bumps 26 and the flip chip bonding pads 43 may be achieved via a flip chip bonding process. The flip chip bonding process may involve a conventional reflow soldering technique. In addition (or as an alternative) to the flip chip bonding process, a non-conductive adhesive film (not shown) may be provided around the chip bumps 26 and in contact with the flip chip bonding pads 43. The non-conductive adhesive film may mechanically fix the chip bumps 26 to the flip chip bonding pads 43.

The upper unit package 30b may be stacked on the lower unit package 30a. The chip bumps 26 of the upper unit package 30b may be mechanically and electrically connected to the flip chip bonding pads 13 of the circuit substrate 10 of the lower unit package 30a. The mechanical connection between the chip bumps 26 and the flip chip bonding pads 13 may be achieved via a flip chip bonding process. The flip chip bonding process may involve a conventional reflow soldering technique. In addition (or as an alternative) to the flip chip bonding process, a non-conductive adhesive film (not shown) may be provided around the chip bumps 26 and in contact with the flip chip bonding pads 13. The non-conductive adhesive film may mechanically fix the chip bumps 26 to the flip chip bonding pads 13.

In this example embodiment, the electrical connections between the IC chip 20 and the circuit substrate 10 of each of the unit packages 30a and 30b may be achieved using the bonding wires 32 (for example). The electrical connections between the lower unit package 30a and the upper unit package 30b may be achieved using the chip bumps 26. The electrical connections between the lower unit package 30a and the second circuit substrate 40 may be achieved using the chip bumps 26. The stack structure may be fabricated using a wire bonding method and a flip chip bonding method, for example.

Figure 5:
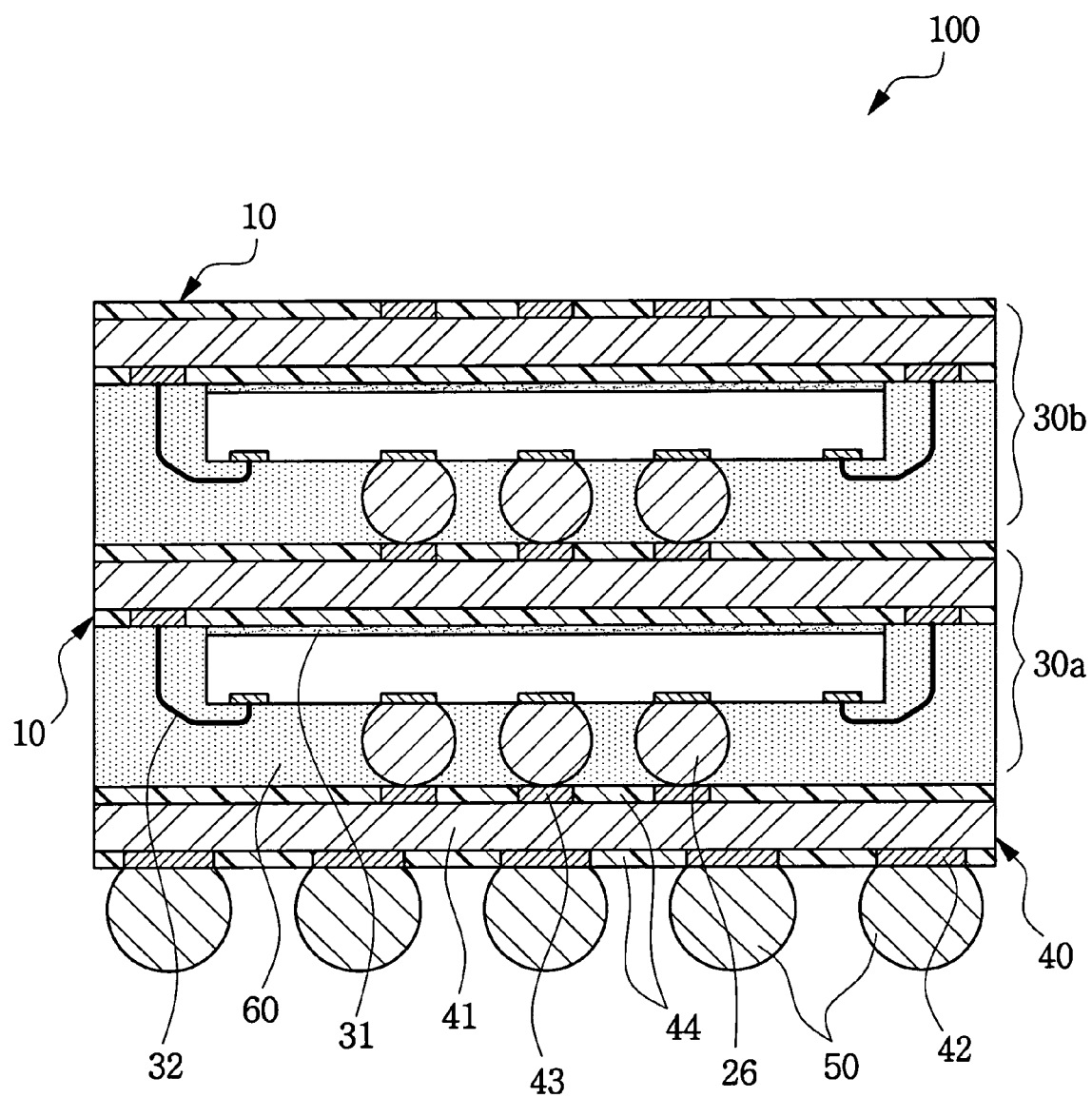
FIG. 5 is a cross-sectional view of a semiconductor chip stack package in accordance with an example, non-limiting embodiment of the present invention.

FIG. 5 is a cross-sectional view of a semiconductor chip stack package 100 in accordance with an example, non-limiting embodiment of the present invention.

Referring to FIG. 5, a molding resin 60 may be provided. The molding resin 60 may protect the stack structure. A plurality of solder bumps 50 may be provided on the lower surface of the second circuit substrate 40.

The molding resin 60 may be provided in a vacant space within each unit package 30a and 30b. The molding resin 60 may secure and/or protect the chip bumps 26 and the bonding wires 32. By way of example only, a molding process may be simultaneously performed on the entire chip stack structure. In alternative embodiments, a plurality of molding process may be sequentially performed on portions of the chip stack structure. The molding process may be simultaneously applied to a plurality of chip stack packages 100. In this case, the molding process may involve separating individual stack packages 100 from a circuit substrate strip (as will be discussed in more detail below).

The solder bumps 50 may serve as external connection terminals of the chip stack package 100. The solder bumps 50 may be provided on the solder bump pads 42 of the second circuit substrate 40. The solder bumps 50 may be relatively larger in size than the chip bumps 26. The solder bumps 50 may be arranged over the lower surface of the second circuit substrate 40. As shown, the solder bumps 50 may have a spherical shape. In alternative embodiments, the solder bumps 50 may have any other geometric shape.

The solder bumps 50 may be provided on the second circuit substrate 40, independent of the unit packages 30a and 30b. Thus, the stack package 100 may not need to change the unit package configuration depending on a connection interface of external devices to which the stack package 100 may be connected. Instead, the size of the second circuit substrate 40, and the quantity and/or arrangement of the solder bumps 50 may be changed depending on connection interface of external devices.

Figure 6A:
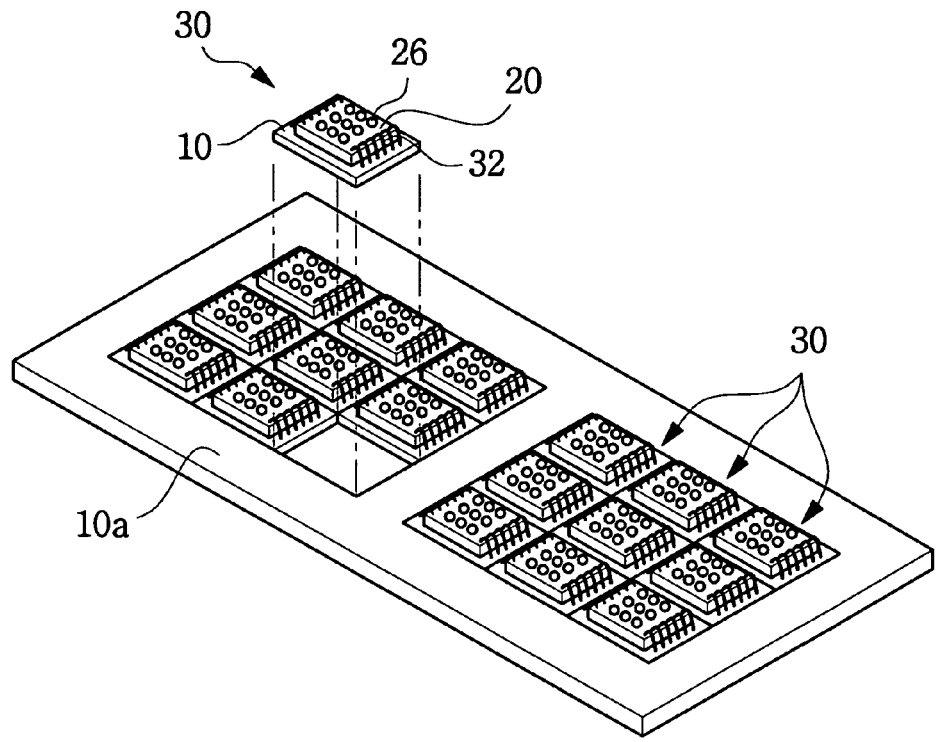
FIGS. 6A through 6C are schematic perspective views of a method for manufacturing a semiconductor chip stack package in accordance with an example, non-limiting embodiment of the present invention.
Figure 6B:
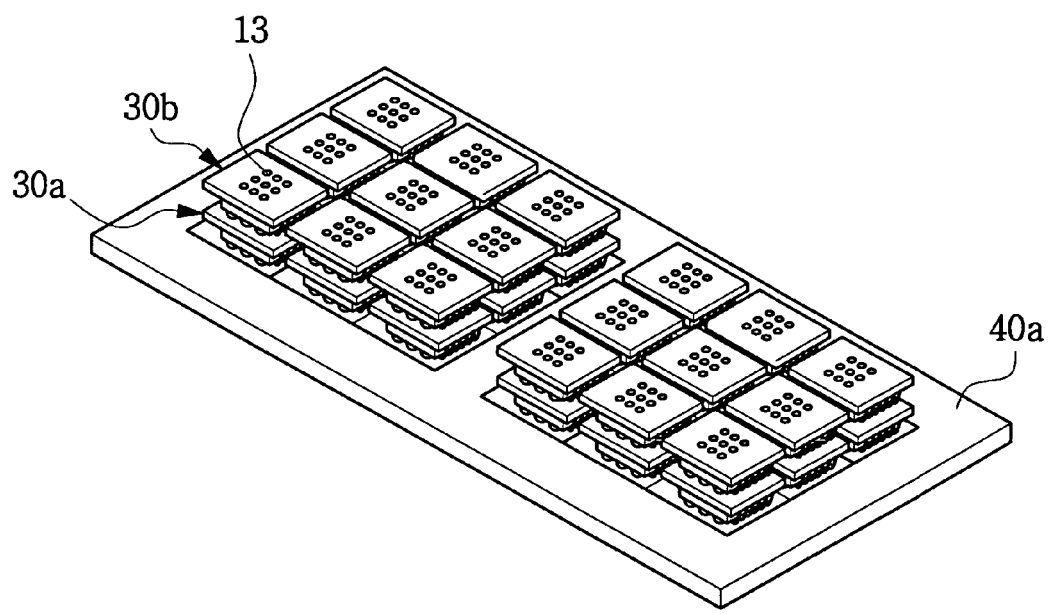
Figure 6C:
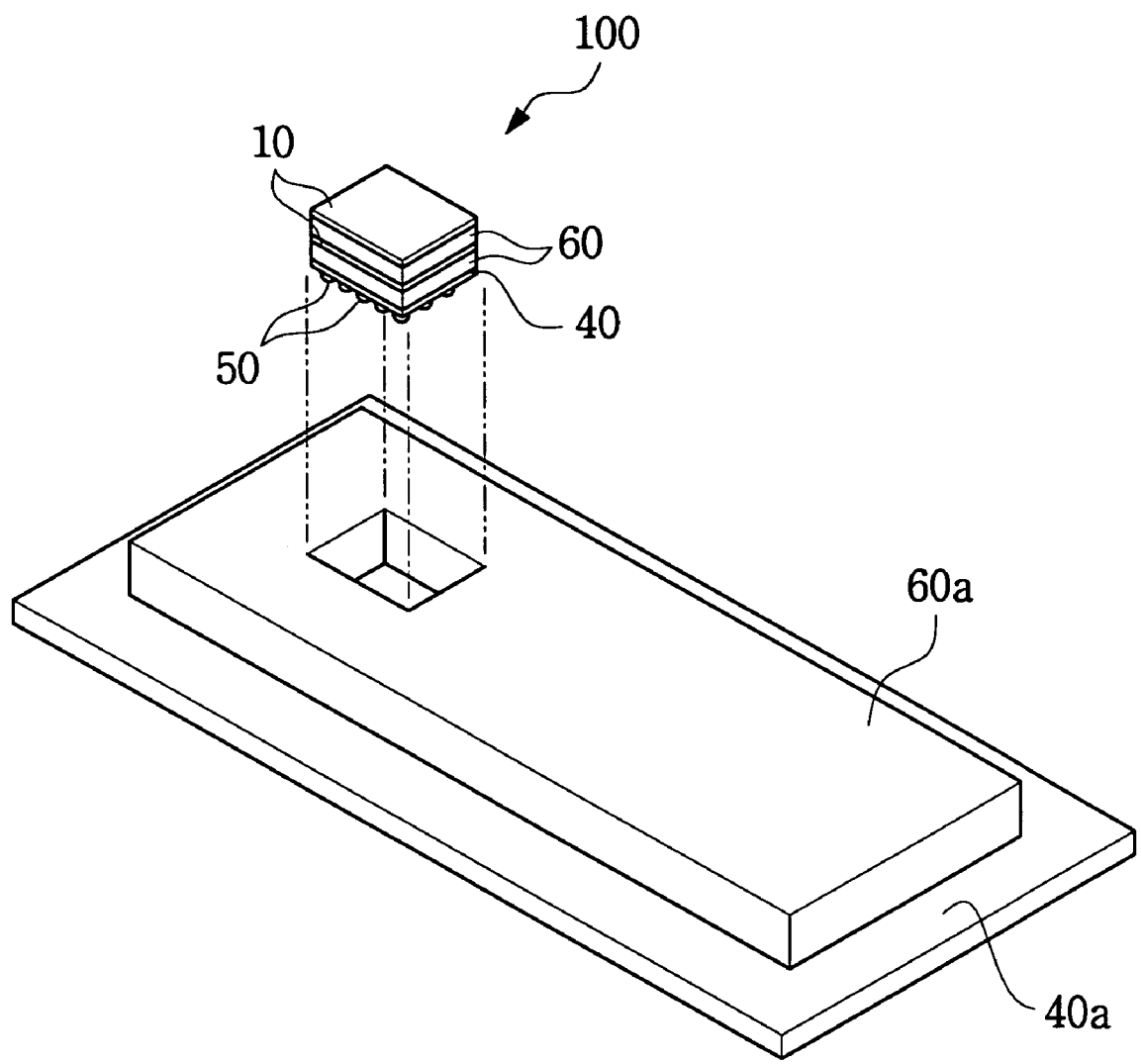

FIGS. 6A through 6C are perspective views of a method for manufacturing a semiconductor chip stack package 100 in accordance with an example, non-limiting embodiment of the present invention.

Referring to FIG. 6A, a circuit substrate strip 10a may include a plurality of circuit substrates 10. IC chips 20 may be provided on and electrically connected to the circuit substrates 10 to form a plurality of unit packages 30. The unit package 30 may have the same structure as the unit package of FIG. 2. Chip bumps 26 may be provided on an upper surface of the IC chip 20. The IC chip 20 may be electrically connected to the circuit substrate 10 using bonding wires 32.

A plurality of the unit packages 30 may be individually separated from the circuit substrate strip 10a. The separating process may involve a mechanical sawing method and/or a laser sawing method, for example.

Referring to FIG. 6B, individual unit packages 30a and 30b may be mounted on a second circuit substrate strip 40a. A stack structure may be the same as the stack structure of FIG. 4.

Referring to FIG. 6C, a molding resin 60a may be provided to seal a plurality of the stack structures. The molding process may be simultaneously applied to all of the stack structures on the second circuit substrate strip 40a. This simultaneous molding process may improve productivity. The individual stack packages 100 on the second circuit substrate 40a may be separated via a separating process that may involve a mechanical sawing method and/or a laser sawing method.

A plurality of solder bumps 50 may be formed on the second circuit substrate 40. The resultant semiconductor chip stack package 100 may have the same structure as the stack package of FIG. 5.

Figure 7:
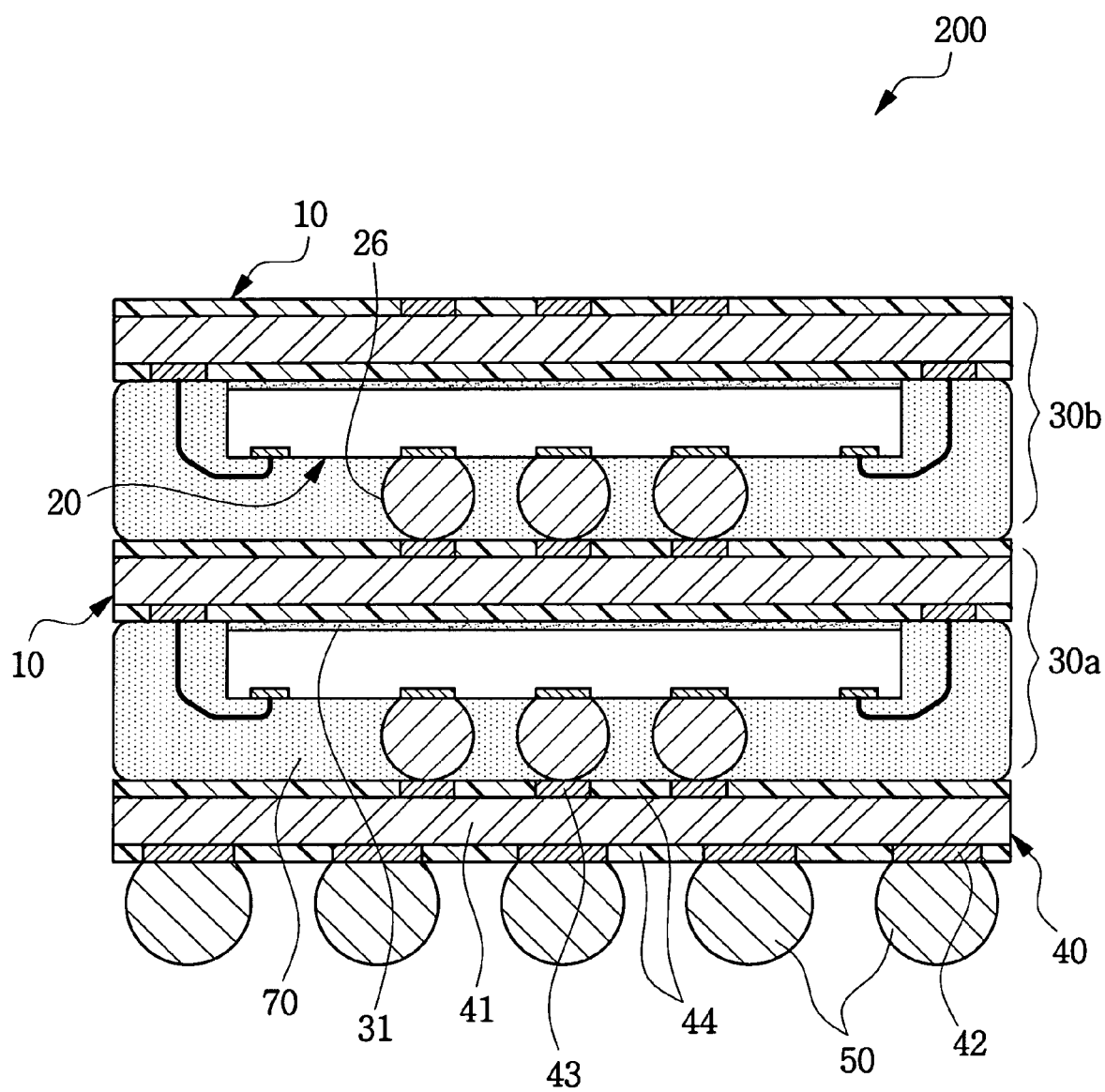
FIG. 7 is a cross-sectional view of a semiconductor chip stack package in accordance with another example, non-limiting embodiment of the present invention.

FIG. 7 is a cross-sectional view of a semiconductor chip stack package 200 in accordance with another example, non-limiting embodiment of the present invention.

The semiconductor chip stack package 200 may have the same structure as the chip stack package 100 of FIG. 5, except that an underfill resin 70 may be implemented (instead of the molding resin 60). The underfill resin 70 may be implemented when (for example) the size of the chip bump 26 may be relatively small and the space between the IC chip 20 and the circuit substrate 10 may be relatively small.

The underfill resin 70 may be implemented together with a molding resin. In this case, the underfill resin 70 may be provided first, and the molding resin may be provided after providing the underfill resin 70.

In the example, non-limiting embodiments, a given semiconductor chip stack package may implement the same kind of IC chips 20 having the same size, etc. In alternative embodiments, the semiconductor chip stack package may have different kinds of chips having different sizes, for example. Furthermore, a given semiconductor chip stack package may include two or more unit packages.

Figure 8:
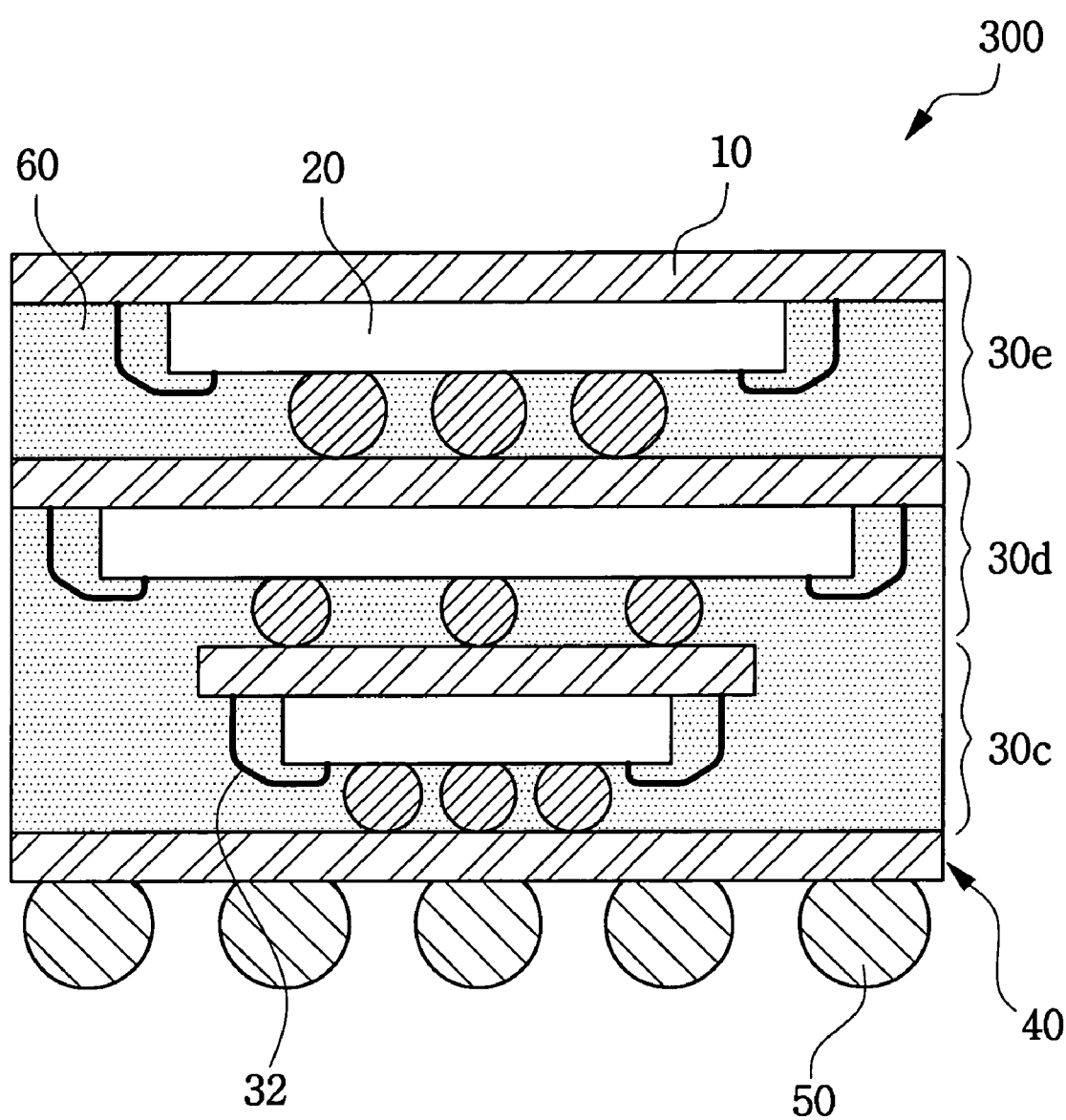
FIG. 8 is a cross-sectional view of a semiconductor chip stack package in accordance with another example, non-limiting embodiment of the present invention.

FIG. 8 is a cross-sectional view of a semiconductor chip stack package 300 in accordance with another example, non-limiting embodiment of the present invention.

Referring to FIG. 8, the chip stack package 300 may have the same structure as the packages 100 and 200, except for having three unit packages 30c, 30d and 30e. The unit packages 30c, 30d and 30e may include IC chips 20 of different kinds and/or sizes. The unit packages 30c, 30d and 30e may include circuit substrates 10 having different sizes. The chip stack package 300 having different kinds of IC chips may be referred to as a multi-chip stack package.

Although example, non-limiting embodiments of the present invention have been described in detail, it will be understood that many variations and/or modifications of the basic inventive concepts, which may appear to those skilled in the art, will still fall within the spirit and scope of the example embodiments of the present invention as defined in the appended claims.

What is claimed is:

1. A package comprising:
   a lower unit package;
   an upper unit package;
   each of the upper and the lower unit packages including:
      a circuit substrate core having a lower surface and an upper surface, each of the lower surface and the upper surface having a solder mask thereon, wire bonding pads provided directly on the lower surface of the substrate core and chip bonding pads provided directly on the upper surface of the substrate core,
      an IC chip provided on the lower surface of the circuit substrate, the IC chip having an active surface with wire lands and bump lands,
      chip bumps provided on the bump lands, and
      bonding wires connecting the wire bonding pads to the wire lands;
   a second circuit substrate having a lower surface and an upper surface, the second circuit substrate having solder bump pads provided on the lower surface and chip bonding pads provided on the upper surface,
   the chip bumps of the upper unit package being connected to the chip bonding pads of the lower unit package and the chip bumps of the lower unit package being connected to the chip bonding pads of the second circuit substrate; and
   external connection terminals provided on the solder bump pads of the second circuit substrate.

2. The package of claim 1, further comprising:
   a molding resin provided in each of the lower and the upper unit packages.

3. The package of claim 1, further comprising:
   an underfill resin provided in each of the lower and the upper unit packages.

4. The package of claim 1, wherein the substrate core has at least one layer of a dielectric material and at least one conductive layer.

5. The package of claim 1, wherein each of the lower and the upper unit packages includes an adhesive layer provided between the IC chip and the lower surface of the circuit substrate.

6. The package of claim 5, wherein the adhesive layer includes one of a liquid adhesive and an adhesive sheet.

7. The package of claim 1, wherein connecting portions of the bonding wires at the wire lands and the wire bonding pads are one of a ball-ball type, a ball-wedge type, a wedge-ball type and a wedge-wedge type.

8. The package of claim 1, wherein the bonding wires have heights that are less than that of the chip bumps relative to the active surface of the IC chip.

9. The package of claim 1, wherein the IC chip of the lower unit package is different in one of kind and size than the IC chip of the upper unit package.

10. A package comprising:
    an upper unit package and a lower unit package, each including
        a circuit substrate core having chip bonding pads formed directly on a surface thereof,
        an IC chip provided on the circuit substrate, the IC chip having an active surface with bump lands, and
        chip bumps provided on the bump lands;
    a second circuit substrate having an upper surface supporting chip bonding pads and a lower surface supporting solder bump pads,
    the chip bumps of the upper unit package being connected to the chip bonding pads of the lower unit package and the chip bumps of the lower unit package being connected to the chip bonding pads of the second circuit substrate; and
    external connection terminals provided on the solder bump pads of the second circuit substrate.

11. The package of claim 10, wherein each of the at least two unit packages includes a bonding wire electrically connecting the circuit substrate to the IC chip.

12. The package of claim 11, wherein the bonding wire is connected to a wire land on the active surface of the IC chip.

13. The package of claim 10, wherein the IC chip includes a substrate;
    a conductive layer provided on the substrate, the conductive layer defining
        a bump land for supporting a chip bump and
        a wire land for connecting to a bonding wire,
    the bump land and the wire land being spaced apart from each other on an active surface of the IC chip.

* * * * *